US012713849B2

(12) United States Patent
Lim et al.

(10) Patent No.: US 12,713,849 B2
(45) Date of Patent: Aug. 18, 2026

(54) IN SITU ACYCLIC DIAMINO CARBENE (ADC) DEPOSITION

(71) Applicants: Applied Materials, Inc., Santa Clara, CA (US); National University of Singapore, Singapore (SG)

(72) Inventors: Wei Chun Lim, Singapore (SG); Andrea Leoncini, Singapore (SG); Han Vinh Huynh, Singapore (SG); Sara Raquel Mota Merelo de Aguiar, Singapore (SG)

(73) Assignees: Applied Materials, Inc., Santa Clara, CA (US); National University of Singapore, Singapore (SG)

( * ) Notice: Subject to any disclaimer, the term of this patent is extended or adjusted under 35 U.S.C. 154(b) by 362 days.

(21) Appl. No.: 18/621,661

(22) Filed: Mar. 29, 2024

(65) Prior Publication Data

US 2025/0308884 A1 Oct. 2, 2025

(51) Int. Cl.

| | |
|---|---|
| ***H01L 21/02*** | (2006.01) |
| ***H10P 14/60*** | (2026.01) |
| ***H10P 14/68*** | (2026.01) |

(52) U.S. Cl.
CPC ........ *H10P 14/668* (2026.01); *H10P 14/6334* (2026.01); *H10P 14/683* (2026.01)

(58) Field of Classification Search
None
See application file for complete search history.

(56) References Cited

U.S. PATENT DOCUMENTS

| | | | |
|---|---|---|---|
| 7,214,600 B2 | 5/2007 | Won et al. | |
| 9,899,212 B2 | 2/2018 | Shestopalov et al. | |
| 11,120,995 B2 | 9/2021 | Hsu et al. | |
| 11,545,354 B2 | 1/2023 | Bhuyan et al. | |
| 2012/0323008 A1 | 12/2012 | Barry et al. | |
| 2016/0060754 A1 | 3/2016 | Noh et al. | |
| 2016/0289248 A1* | 10/2016 | Johnson | C07F 7/081 |

(Continued)

FOREIGN PATENT DOCUMENTS

| | | |
|---|---|---|
| CN | 113838744 A | 12/2021 |
| JP | 2019212776 A | 12/2019 |

(Continued)

OTHER PUBLICATIONS

Peltier, Jesse L., et al., "Absolute Templating of M(111) Cluster Surrogates by Galvanic Exchange", HAL Open Science, Journal of the American Chemical Society, 2020, 11 pages.

(Continued)

*Primary Examiner* — Alexander M Weddle
(74) *Attorney, Agent, or Firm* — Servilla Whitney LLC

(57) ABSTRACT

Methods of selectively depositing a passivation layer on a metal surface of a semiconductor substrate are described. Exemplary methods may include exposing the semiconductor substrate having a metal surface and a non-metal surface to a first precursor to form a first portion of the passivation layer on the metal surface, the first precursor including an isonitrile. The exemplary methods may further include exposing the semiconductor substrate comprising a metal surface and a non-metal surface to a second precursor to form the passivation layer on the metal surface. The second precursor may include an amine, an alcohol, or a thiol.

20 Claims, 3 Drawing Sheets

(56) References Cited

U.S. PATENT DOCUMENTS

| | | | |
|---|---|---|---|
| 2016/0343580 | A1 | 11/2016 | Hudson |
| 2017/0352533 | A1 | 12/2017 | Tois et al. |
| 2017/0352550 | A1 | 12/2017 | Tois et al. |
| 2018/0342388 | A1 | 11/2018 | Chakraborty et al. |
| 2019/0294046 | A1 | 9/2019 | Nishimaki et al. |
| 2019/0368034 | A1 | 12/2019 | Liu et al. |
| 2021/0115559 | A1 | 4/2021 | Sharma et al. |
| 2021/0175092 | A1 | 6/2021 | Tois et al. |
| 2021/0277516 | A1 | 9/2021 | Bhuyan et al. |
| 2022/0028686 | A1 | 1/2022 | Bhuyan et al. |
| 2022/0131096 | A1 | 4/2022 | Wang et al. |

FOREIGN PATENT DOCUMENTS

| | | | |
|---|---|---|---|
| KR | 20020043702 | A | 6/2002 |
| WO | 2019173074 | A2 | 9/2019 |
| WO | 2023201437 | A1 | 10/2023 |

OTHER PUBLICATIONS

Yarbrough, Josiah , et al., "Next generation nanopatterning using small molecule inhibitors for area-selective atomic layer deposition", J. Vac. Sci. Technol. A 39, 021002 (2021).
Zhang, Chao, et al., "Area-Selective Molecular Layer Deposition of Polyimide on Cu through Cu-Catalyzed Formation of a Crystalline Interchain Polyimide", Chem. Mater. 2020, 32, 5073-5083.
"PCT International Search Report and Written Opinion in PCT/US2025/020816 dated Jul. 10, 2025, 8 pages".
Lazar, et al., "Non-nanogold catalysis of reactions of isocyanides, secondary amines, and oxygen to give ureas", J. Phys. Chem. C, 2007, vol. 111, No. 11, pp. 4074-4076.

* cited by examiner

IN SITU ACYCLIC DIAMINO CARBENE (ADC) DEPOSITION

TECHNICAL FIELD

Embodiments of the disclosure relate to methods for selectively depositing a passivation layer on a semiconductor substrate. In particular, embodiments of the disclosure are directed to methods of depositing carbene-based passivation layers selectively on metal surfaces, including by depositing a first precursor and a second precursor such that carbene-based species may be formed in situ.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

The semiconductor industry faces many challenges in the pursuit of device miniaturization which involves rapid scaling of nanoscale features. Such issues include the introduction of complex fabrication steps such as multiple lithography steps and integration of high-performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor.

Small-molecule inhibitors (SMIs) are molecular species that can be used as precursors to form a passivation layer that may provide certain benefits over the use of self-assembled monolayers (SAMs). SAMs are organic films composed of amphiphilic molecules that are widely used as passivation layers; however, SAMs possess disadvantages for downscaling of device applications (e.g., substrates smaller than about 10 nm) and for high-volume manufacturing applications. SMIs may provide certain advantages over the use of SAMs. For example, the high volatility of SMIs allows for delivery in the vapor phase, thus avoiding complex wet chemistry steps. Moreover, due to their small size, SMIs may be more precisely deposited on smaller and higher aspect ratio substrate features in comparison to SAMs. Because they can be deposited in the vapor phase, SMIs may also be reapplied during a device process, such as atomic layer deposition (ALD), to refurbish or replenish the passivation layer.

Area-selective deposition (ASD) can be used for selective deposition of precursors on one substrate surface over another, such as on a metal/metallic surface over a dielectric surface. During ASD on a metal/metallic surface, material deposition on the metal/metallic surface requires the development of molecules that can form a passivation layer that is both chemically and thermally stable on the metal/metallic surface, while at the same time having a high selectivity for the metal/metallic surface over the dielectric surface. There is an ongoing need in the art, therefore, for methods to improve the stability of passivation layers and to avoid the problems encountered during ASD.

SUMMARY

One or more embodiments of the disclosure are directed to a method of selectively depositing a passivation layer on a semiconductor substrate, the method comprising: exposing the semiconductor substrate comprising a metal surface and a non-metal surface to a first precursor to form a first portion of the passivation layer on the metal surface, the first precursor comprising an isonitrile of general formula (I), wherein $R^1$ comprises one or more of a linear alkyl, branched alkyl, cyclic alkyl, substituted or unsubstituted benzyl, silyl, and substituted or unsubstituted aryl groups; and exposing the semiconductor substrate comprising a metal surface and a non-metal surface to a second precursor to form the passivation layer on the metal surface, the second precursor having a general formula (II) wherein $R^2$ comprises one or more of a linear or branched $C_{1-24}$ alkyl, substituted linear or branched $C_{1-24}$ alkyl, substituted or unsubstituted $C_{5-7}$ cyclic alkyl, and benzyl substituted with alkyl, alkoxy, or thio, and X comprises —NH—, —O—, or —S—.

One or more embodiments of the present disclosure is directed to a method of selectively depositing a passivation layer on a semiconductor substrate, the method comprising: a first process cycle comprising exposing the semiconductor substrate comprising a metal surface and a non-metal surface to a first precursor to form a first portion of the passivation layer on the metal surface, the first precursor comprising an isonitrile of general formula (I), $R^1$ comprising one or more of a linear alkyl, branched alkyl, cyclic alkyl, substituted or unsubstituted benzyl, silyl, and substituted or unsubstituted aryl groups and exposing the semiconductor substrate comprising a metal surface and a non-metal surface to a second precursor to form the passivation layer on the metal surface, the second precursor having a general formula (II), $R^2$ comprising one or more of a linear or branched $C_{1-24}$ alkyl, substituted linear or branched $C_{1-24}$ alkyl, substituted or unsubstituted $C_{5-7}$ cyclic alkyl, and benzyl substituted with alkyl, alkoxy, or thio, and X comprising —NH—, —O—, or —S—; and repeating the first process cycle n number of times wherein n is an integer in a range of from 1 to 100 to form the metal layer saturated with the passivation layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
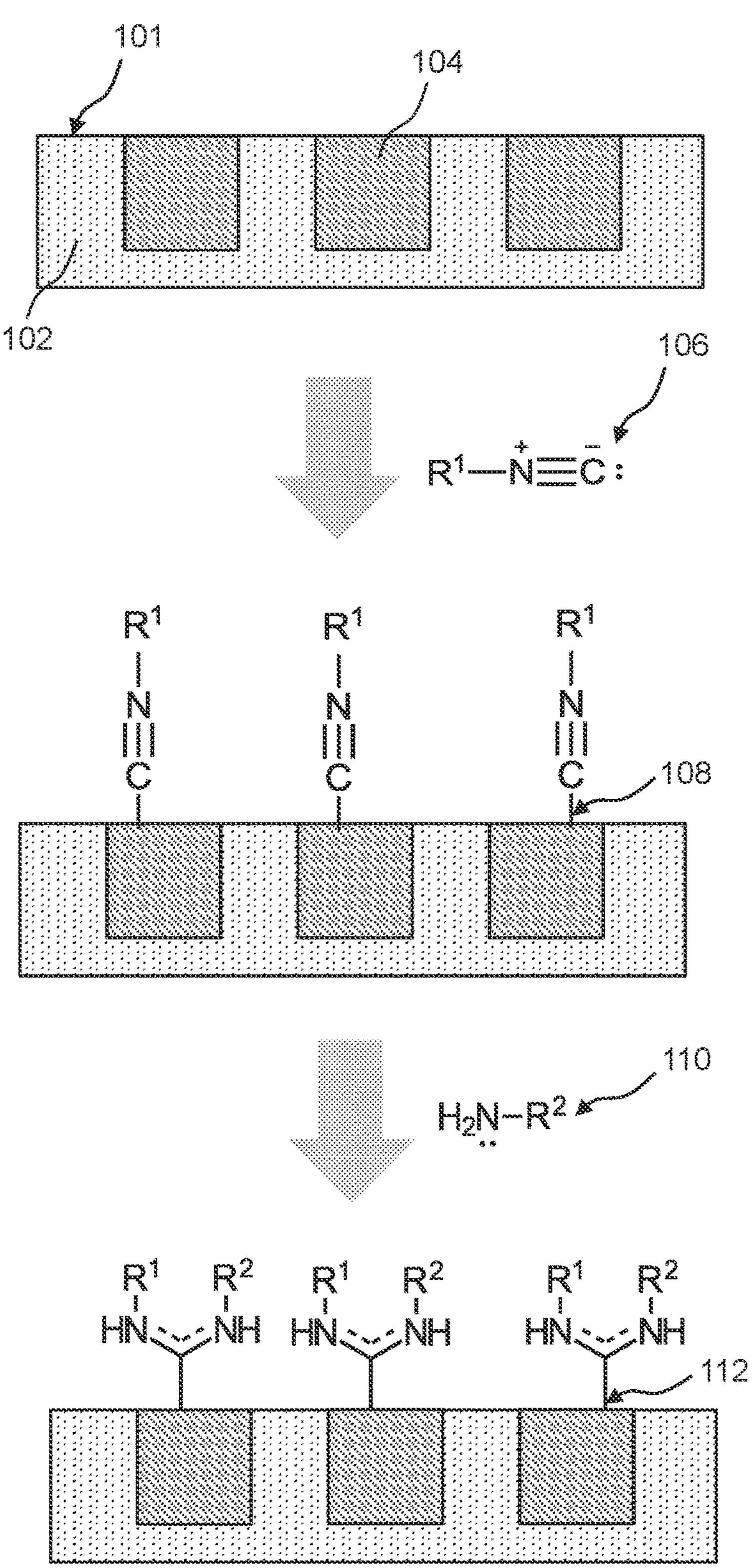
FIG. 1 illustrates cross-sectional views of a substrate according to one or more embodiments.

Before describing several exemplary embodiments of the invention, it is to be understood that the invention is not limited to the details of construction or process steps set forth in the following description. The invention is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" or "substrate surface", as used herein, refers to any portion of a substrate or portion of a material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. Substrates may have various dimensions, such as 200 mm or 300 mm diameter wafers, as well as rectangular or square panes. In some embodiments, the substrate comprises a rigid discrete material.

The term "on" indicates that there is direct contact between elements. The term "directly on" indicates that there is direct contact between elements with no intervening elements.

As used in this specification and the appended claims, the terms "precursor," "reactant," "reactive gas" and the like are used interchangeably to refer to any gaseous species that can react with the substrate surface.

As used in this specification and the appended claims, the terms "reactive compound", "reactive gas", "reactive species", "precursor", "process gas" and the like are used interchangeably to mean a substance with a species capable of reacting with the substrate or material on the substrate in a surface reaction (e.g., chemisorption, oxidation, reduction, cycloaddition). The substrate, or portion of the substrate, is exposed sequentially to the one or more reactive compounds which are introduced into a reaction zone of a processing chamber.

As used herein, the term "purge" or "purging" includes any suitable purge process that removes unreacted precursor, or reaction products, effluents, or by-products thereof, from the processing region. The suitable purge process includes moving the substrate through a gas curtain to a portion or sector of the processing region that contains none or substantially none of the reactant. In one or more embodiments, purging the processing chamber comprises applying a vacuum. The purging may purge, or remove, one or more precursor or ligand, or effluent or side product of a precursor or ligand, from the substrate processing region. The effluents may be removed by pumping them out of the substrate processing region. In some embodiments, purging the processing region comprises flowing a purge gas over the substrate. In some embodiments, the purge process comprises flowing an inert gas. In one or more embodiments, the purge gas is selected from one or more of nitrogen ($N_2$), helium (He), and argon (Ar). In some embodiments, the reactive species is purged from the reaction chamber for a time duration in a range of from 0.1 seconds to 30 seconds, from 0.1 seconds to 10 seconds, from 0.1 seconds to 5 seconds, from 0.5 seconds to 30 seconds, from 0.5 seconds to 10 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds, before optionally exposing the substrate to a second reactive species.

Carbon-containing passivation layers may be deposited during semiconductor device manufacturing for a number of structures and processes, including as a mask material, an etch resistant material, and a trench fill material, among other applications. More specific examples of applications for carbon-containing materials include the formation of hot implant hard masks, metal gate (MG)-cut hard masks, metal gate fabrication, and reverse tone patterning, self-aligned patterning, among others. The present technology includes the selective formation of these carbon-containing materials on metal/metallic surfaces using ASD.

Embodiments of the present technology include deposition methods to deposit a small-molecule inhibitor (SMI) passivation layer selectively on a metal/metallic surface over a non-metal/non-metallic or dielectric surface. Exemplary methods may include exposing a metal/metallic surface of the substrate to a first precursor to form a first portion of the SMI passivation layer, the first precursor comprising an isonitrile of general formula (I):

(I)

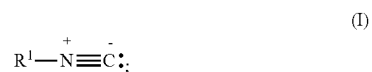

and exposing the metal/metallic surface to a second precursor to form the passivation layer on the metal/metallic surface, the second precursor having a general formula (II):

(II)

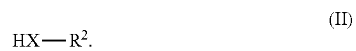

In some embodiments, the methods may include repeating depositions of first and second precursors until the metal/metallic surface of the substrate is fully passivated.

One or more embodiments advantageously provides solutions to problems with conventional methods of forming an SMI passivation layer on a semiconductor substrate. For example, the present technology may utilize carbenes, including acyclic diamino carbenes (ADCs). In one or more embodiments, carbenes form advantageously strong binding interactions to metals, thus yielding a passivation layer that is both thermally and chemically stable relative to layers formed using many non-carbene passivation precursors.

It is known, however, that carbenes, including ADCs, are challenging to isolate in their pure forms and difficult to handle due to their inherently high reactivity. The standard approach for deposition of precursors on a substrate surface is to volatilize the precursor into the vapor phase in order to deliver it to the substrate surface. However, volatilization poses challenges with carbenes, which are typically too reactive and thermally unstable for delivery to the substrate surface from the vapor phase.

The present technology advantageously provides solutions to the challenges of working with carbenes by providing a first precursor and a second precursor that may react to form a carbene complex in situ on the metal surface. No prior synthesis of a carbene is needed, thus eliminating the significant challenges of synthesis and isolation of carbenes in their free form. The selectivity of reactions of the precursors of the present technology ensures a clean deposition of carbenes with no unwanted side reactions.

Furthermore, some methods of depositing passivation layers on metal/metallic surfaces may utilize precursors containing halogen-metal bonds. The presence of halogen-metal bonds in a passivation layer on a metal/metallic surface has certain disadvantages, including contributing to corrosion of the metal/metallic surface. The present technology may overcome these problems by, in some embodiments, introducing stable carbene species without the use of halogen-metal bonds.

One or more embodiments advantageously provides solutions to problems with conventional plasma deposition methods of forming carbon-containing passivation layers on semiconductor substrates. Conventional plasma deposition methods such as plasma-enhanced chemical-vapor-deposition (PECVD) and high-density-plasma chemical-vapor-deposition (HDPCVD) often create ion sputtering that causes damage to substrate features on the semiconductor substrate and can also create re-sputtered ions and other species that can cause defects in the deposited carbon-containing material. In addition, they often deposit the material unevenly in and around substrate features, creating voids in and around substrate trenches and steps, and uneven surfaces in planar substrate regions. The present technology may form carbon-containing materials with a high level of conformity in narrow substrate features (e.g., dimension widths less than about 25 nm) and high aspect ratios (e.g., AR of 10:1 or more) without the need for plasmas that can damage the substrate feature during deposition.

The embodiments of the disclosure are described by way of the Figures, which illustrate devices (e.g., transistors) and methods of forming semiconductor structures in accordance with one or more embodiments of the disclosure. The methods shown are merely illustrative possible uses for the disclosed methods, and the skilled artisan will recognize that the disclosed methods are not limited to the illustrated applications.

FIG. 1 illustrates a cross-sectional view of a substrate having one or more metal surface 104 and one or more non-metal surface 102. Referring to FIG. 1, in one or more embodiments, a semiconductor substrate 100 includes a semiconductor substrate surface 101. The semiconductor substrate surface 101 includes a metal surface 104 and a non-metal surface 102. In some embodiments, the non-metal surface 102 comprises a dielectric surface. In some embodiments, the non-metal surface 102 comprises one or more of a dielectric surface, a semiconductor surface, a non-metal surface, or a metal surface where the metal is different from the metal of the metal surface 104.

A "metal," as used herein, refers to metal, metal alloy, metal oxide, metal nitride, or combination thereof. A "metal surface," "metallic surface," or "metal layer" as used herein, refers to any portion of a substrate or portion of a material surface formed with the metal.

In one or more embodiments, the metal surface 104 comprises a metal, a metal alloy, a metal oxide, a metal nitride, or a combination thereof. Non-limiting examples of metal include copper (Cu), cobalt (Co), nickel (Ni), tungsten (W), ruthenium (Ru), rhodium (Rh), palladium (Pd), iridium (Ir), chromium (Cr), iron (Fe), platinum (Pt), gold (Au), silver (Ag), molybdenum (Mo), manganese (Mn), gallium (Ga), indium (In), tungsten (W), titanium (Ti), tantalum (Ta), aluminum (Al), nickel (Ni), oxides thereof, nitrides thereof, or combinations thereof.

The metal surface may be exposed to a pretreatment process to polish, coat, dope, etch, reduce, oxidize, hydroxylate, anneal, UV cure, e-beam cure and/or bake the substrate. In addition to the pretreatment directly on the metal surface itself, any of the metal surface treatment disclosed may also be performed on an underlayer metal surface as disclosed in more detail below, and the term "metal surface" is intended to include such underlayer as the context indicates. Thus, for example, where a film/layer or partial film/layer has been deposited onto the metal surface, the exposed surface of the newly deposited film/layer becomes the metal surface.

A "dielectric surface," as used herein, refers to any portion of a substrate or portion of a material surface formed with a dielectric material. Non-limiting examples of dielectric material include silicon oxide ($SiO_x$), silicon nitride ($Si_xN_y$), silicon (Si), silicon oxynitride (SiON), carbides, oxycarbides, nitrides, oxynitrides, oxycarbonitrides, polymers, phosphosilicate glass, fluorosilicate (SiOF) glass, organosilicate glass (SiOCH), aluminum oxide ($AlO_x$), hafnium oxide ($HfO_x$), zirconium oxide ($ZrO_2$), titanium oxide ($TiO_x$), titanium nitride (TiN), tantalum oxide ($Ta_xO_5$), yttrium oxide ($Y_2O_3$), lanthanum oxide ($La_2O_3$), aluminum nitride (AlN), magnesium oxide (MgO), calcium fluoride ($CaF_2$), lithium fluoride (LiF), strontium oxide (SrO), silicon carbide (SiC), barium oxide (BaO), hafnium silicate ($HfSiO_4$), lanthanum aluminate ($LaAlO_3$), niobium pentoxide ($Nb_2O_5$), barium titanate ($BaTiO_3$), strontium titanate ($SrTiO_3$), bismuth titanate ($Bi_4Ti_3O_{12}$), lead zirconium titanate ($Pb(Zr, Ti)O_3$), calcium copper titanate ($CaCu_3Ti_4O_{12}$), lithium niobate ($LiNbO_3$), barium titanate ($BaTiO_3$), and potassium niobate ($KNbO_3$). In one or more specific embodiments, the non-metal surface 102 comprises one or more of silicon oxide ($SiO_x$), silicon oxycarbide (SiOC), silicon oxycarbonitride (SiOCN), silicon nitride (SiN), silicon oxynitride (SiON), silicon (Si), germanium (Ge), silicon germanium (SiGe), silicon carbide (SiC), indium gallium zinc oxide (InGaZnO), aluminum oxide ($AlO_x$), aluminum nitride (AlN), and hafnium oxide ($HfO_x$).

According to some embodiments of the present disclosure, the metal surface 104 may be exposed to a first precursor to form a first portion of a passivation layer on the metal surface 104.

Referring to FIG. 1, in some embodiments, the semiconductor surface 101 may be exposed to a first precursor 106. In some embodiments, the first precursor 106 may comprise an isonitrile having general formula (I):

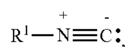 (I)

wherein $R^1$ comprises one or more of a linear alkyl, branched alkyl, cyclic alkyl, substituted or unsubstituted benzyl, silyl, and substituted or unsubstituted aryl groups.

As used herein, the term "alkyl" or "alk," alone or as part of another group, includes both straight and branched chain hydrocarbons, containing 1 to 24 carbons, or 1 to 12 carbon atoms, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted.

The term "$C_{5-7}$ cyclic alkyl" as used herein includes all alkyl groups that include a ring having 5, 6, or 7 atoms.

The alkyl groups, including cyclic alkyl groups, may optionally include up to 1 to 4 substituents such as halo, for example F, Br, Cl, or I, or $CF_3$, alkyl, alkoxy, aryl, aryloxy, aryl(aryl) or diaryl, arylalkyl, arylalkyloxy, alkenyl, cycloalkyl, cycloalkylalkyl, cycloalkylalkyloxy, amino, hydroxy, hydroxyalkyl, acyl, heteroaryl, heteroaryloxy, heteroarylalkyl, heteroarylalkoxy, aryloxyalkyl, alkylthio, arylalkylthio, aryloxyaryl, alkylamido, alkanoylamino, arylcarbonylamino, nitro, cyano, thiol, haloalkyl, trihaloalkyl, and/or alkylthio, and the like.

As used herein, the term "alkene" or "alkenyl" refers to straight or branched chain radicals of 2 to 24 carbons, or 2 to 12 carbons, and 1 to 8 carbons in the normal chain, which include one to six double bonds in the normal chain, such as vinyl, 2-propenyl, 3-butenyl, 2-butenyl, 4-pentenyl, 3-pentenyl, 2-hexenyl, 3-hexenyl, 2-heptenyl, 3-heptenyl, 4-heptenyl, 3-octenyl, 3-nonenyl, 4-decenyl, 3-undecenyl, 4-dodecenyl, 4,8,12-tetradecatrienyl, and the like, and which may be optionally substituted with 1 to 4 substituents, namely, halogen, haloalkyl, alkyl, alkoxy, alkenyl, alkynyl, aryl, arylalkyl, cycloalkyl, amino, hydroxy, heteroaryl, cycloheteroalkyl, alkanoylamino, alkylamido, arylcarbonylamino, nitro, cyano, thiol, alkylthio, and/or any of the alkyl substituents set out herein.

As used herein, the term "alkynyl" refers to straight or branched chain radicals of 2 to 24 carbons, or 2 to 12 carbons, or 2 to 8 carbons in the normal chain, which include one triple bond in the normal chain, such as 2-propynyl, 3-butynyl, 2-butynyl, 4-pentynyl, 3-pentynyl, 2-hexynyl, 3-hexynyl, 2-heptynyl, 3-heptynyl, 4-heptynyl, 3-octynyl, 3-nonynyl, 4-decynyl, 3-undecynyl, 4-dodecynyl, and the like, and which may be optionally substituted with 1 to 4 substituents, namely, halogen, haloalkyl, alkyl, alkoxy, alkenyl, alkynyl, aryl, arylalkyl, cycloalkyl, amino, heteroaryl, cycloheteroalkyl, hydroxy, alkanoylamino, alkylamido, arylcarbonylamino, nitro, cyano, thiol, and/or alkylthio, and/or any of the alkyl substituents set out herein.

As used herein, the term "aryl" refers to monocyclic and bicyclic aromatic groups containing 6 to 10 carbons in the ring portion (such as phenyl, biphenyl or naphthyl, including 1-naphthyl and 2-naphthyl) and may optionally include 1 to 3 additional rings fused to a carbocyclic ring or a heterocyclic ring (such as aryl, cycloalkyl, heteroaryl, or cycloheteroalkyl rings). The aryl group may be optionally substituted through available carbon atoms with 1, 2, or 3 substituents, for example, hydrogen, halo, haloalkyl, alkyl, haloalkyl, alkoxy, haloalkoxy, alkenyl, trifluoromethyl, trifluoromethoxy, alkynyl, and the like.

The term "halogen" or "halo" as used herein alone or as part of another group refers to chlorine, bromine, fluorine, and iodine as well as $CF_3$. In some embodiments, the precursors used in the present disclosure do not include halogens. In some embodiments, the precursor is substantially free of metal-halogen direct coordination. As used herein, the term "substantially free" means that there is less than about 5%, including less than about 4%, less than about 3%, less than about 2%, less than about 1%, and less than about 0.5% of metal-halogen direct coordination, on an atomic basis, in the precursor.

In some embodiments, the first precursor 106 may bind to the metal surface 104, to form a bound first precursor 108, as illustrated in FIG. 1. The bound first precursor may be bound selectively to the metal surface 104 over the non-metal surface 102.

In some embodiments, the first precursor 106 comprises one or more of a linear, branched, or cyclic alkyl substituted with one or more electron withdrawing group (EWG).

The term "electron-withdrawing group" or EWG has its ordinary meaning to the skilled person practicing the art of the present disclosure and includes a functional group that draws from a reaction electrons away center. Exemplary electron withdrawing groups include, but are not limited to, $—C(═O)$, $—CN$, $—NO_2$, $—CZ_3$, $—Z$, $—COOR$, $—CONR_2$, $—COR$, $—COZ$, $—SO_2R$, $—SO_2OR$, $—SO_2NHR$, $—SO_2NR_2$, $—PO_3R_2$, $—P(O)(CH_3)NHR$, NO, $—NR_3+$, $—CR═CR_2$, $—CF_3$ and $—C≡CR$ wherein Z is F, Br, Cl, or I, and R is, at each occurrence, independently from the group consisting of hydrogen and $C_{1-24}$ alkyl.

Exemplary electron withdrawing groups can also include aryl groups (e.g., phenyl) and certain heteroaryl groups (e.g., pyridine). The term "electron withdrawing groups" includes aryls or heteroaryls further substituted with electron withdrawing groups.

Solely by way of example, non-limiting EWGs according to one or more embodiments include $—NO_2$, $—CF_3$, and sulfonyl, or an aromatic ring substituted with one or more EWGs selected from the group consisting of $—NO_2$, $—CF_3$, and sulfonyl.

In some embodiments, the first precursor of general formula (I) may have a structure as illustrated in Table 1.

TABLE 1

Structures of isonitrile first precursors according to some embodiments.

| First Precursor Structure | |
|---|---|
| 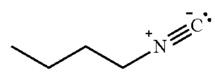 | 1 |
| 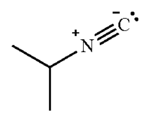 | 2 |
| 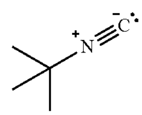 | 3 |

TABLE 1-continued

| Structures of isonitrile first precursors according to some embodiments. | |
|---|---|
| First Precursor Structure | |
| 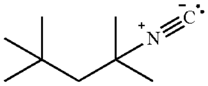 | 4 |
| 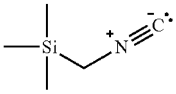 | 5 |
| 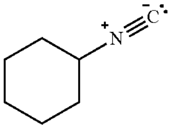 | 6 |
| 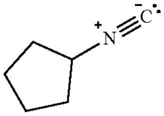 | 7 |
| 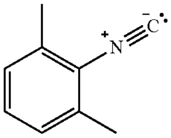 | 8 |
| 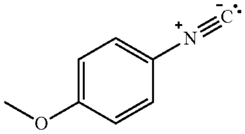 | 9 |
| 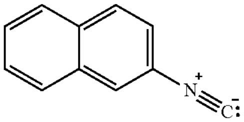 | 10 |
| 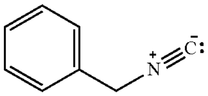 | 11 |

In some embodiments, the first precursor 106 may remain in the substrate processing region for a period of time to nearly, or completely, form the first portion of passivation layer on the metal surface. The first precursor 106 may be delivered in alternating pulses to grow the passivation layer. In some embodiments, the pulse times of the first precursor may be greater than or equal to 0.1 seconds, greater than or equal to 1 second, greater than or equal to 2 seconds, greater than or equal to 3 seconds, greater than or equal to 4 seconds, greater than or equal to 5 seconds, greater than or equal to 10 seconds, greater than or equal to 20 seconds, greater than or equal to 40 seconds, greater than or equal to 60 seconds, greater than or equal to 80 seconds, greater than or equal to 100 seconds, or more.

In some embodiments, the semiconductor surface 101 may also be exposed to a second precursor, such as a second precursor 110 illustrated in FIG. 1. The second precursor may have the general formula (II):

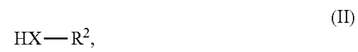

(II)

wherein $R^2$ comprises one or more of a linear or branched $C_{1-24}$ alkyl, substituted linear or branched $C_{1-24}$ alkyl, substituted or unsubstituted $C_{5-7}$ cyclic alkyl, or benzyl substituted with alkyl, alkoxy or thio. In some embodiments, X comprises —NH—, —O—, or —S—.

In some embodiments, the second precursor 110 of general formula (II) may react with the bound first precursor 108 to form the passivation layer 112 on the metal surface 104.

In some embodiments, the second precursor 110 is an amine second precursor, such as the amine second precursor 110 illustrated in FIG. 1. Referring to FIG. 1, the amine second precursor may form a complex with the bound isonitrile first precursor 108 to form a complex 112. The complex 112 of the bound first precursor 108 and the amine second precursor 110 may be an acyclic diamino carbene (ADC), which forms the passivation layer. The ADC may have the general formula (III):

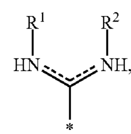

(III)

wherein $R^1$, as defined above, may comprise one or more of a linear alkyl, branched alkyl, cyclic alkyl, substituted or unsubstituted benzyl, silyl, and substituted or unsubstituted aryl groups, and $R^2$, as defined above, may comprise one or more of a linear or branched $C_{1-24}$ alkyl, substituted linear or branched $C_{1-24}$ alkyl, substituted or unsubstituted $C_{5-7}$ cyclic alkyl, or benzyl substituted with alkyl, alkoxy or thio. In some embodiments, the ADC complex may be formed by a nucleophilic addition of the bound first precursor 108 and the second precursor 110.

Figure 2:
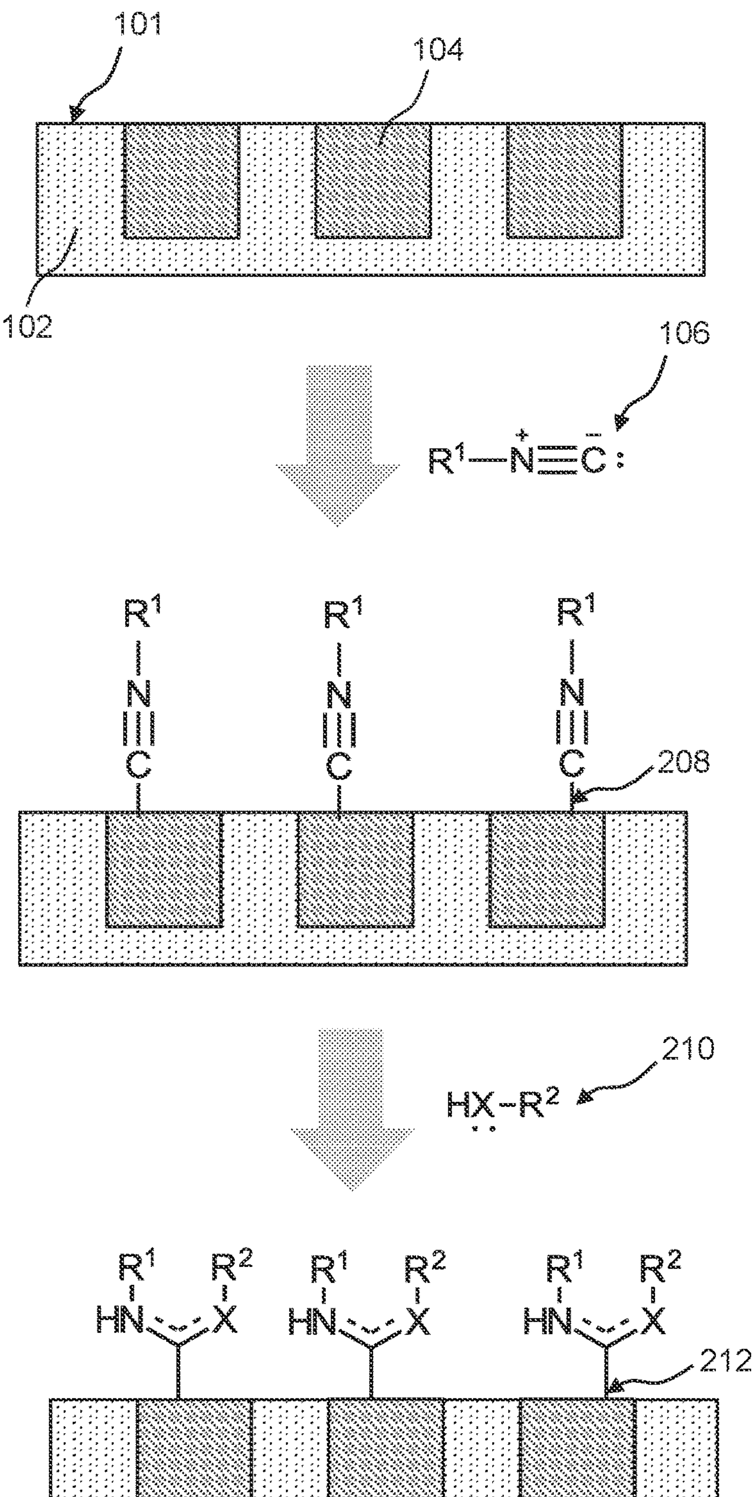
FIG. 2 illustrates cross-sectional views of a substrate according to one or more embodiments.

In some embodiments, the second precursor of general formula (II) is an alcohol ($R^2$—OH) or thiol ($R^2$—SH) second precursor. Referring to FIG. 2, the second precursor of formula (II) 210 may have the general formula $R^2$—XH, where X may be O or S. In one or more embodiments, the second precursor 210 may react with the bound isonitrile first precursor 208 to form a complex 212, which forms the passivation layer on the metal surface 104. The complex 212 of the bound first precursor 208 and the alcohol or thiol second precursor 210 may have the general formula (IV):

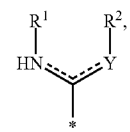

(IV)

wherein Y is O if the second precursor is an alcohol or S if the second precursor is a thiol; $R^1$, as defined above, may comprise one or more of a linear alkyl, branched alkyl, cyclic alkyl, substituted or unsubstituted benzyl, silyl, and substituted or unsubstituted aryl groups; and $R^2$, as defined above, may comprise one or more of a linear or branched $C_{1-24}$ alkyl, substituted linear or branched $C_{1-24}$ alkyl, substituted or unsubstituted $C_{5-7}$ cyclic alkyl, or benzyl substituted with alkyl, alkoxy or thio. In some embodiments, the complex 212 may be formed by a nucleophilic addition of the bound first precursor 208 and the second precursor 210.

In some embodiments, the second precursor of general formula (II) 210 is a nucleophilic amine. In some embodiments, the second precursor of general formula (II) 210 is a highly nucleophilic amine. As used herein, the term "nucleophilic amine" has its ordinary meaning to the skilled person practicing the art of the present disclosure and includes an amine that attacks an electrophilic group and that is capable of reacting with an electrophilic group to form a covalent bond with the electrophilic group. Nucleophilic amines generally are electron rich.

As used herein, the term "highly nucleophilic amine," "strongly nucleophilic amine," and the like, refers to a nucleophilic amine that is substituted with one or more electron-donating groups. Generally, and without being bound by theory, the substitution of a nucleophilic amine with one or more electron-donating groups acts, through induction or resonance, to increase the nucleophilicity of the amine. Non-limiting examples of highly nucleophilic amines include amines substituted with alkyl, cyclic alkyl, alkoxy, hydroxy, aryl, and thio. In some embodiments, the highly nucleophilic amine comprises one or more $t\text{-}BuNH_2$ groups.

In some embodiments, the second precursor is a secondary amine. When the second precursor is a secondary amine, the second precursor may have a general formula $R^2—NH—R^{2'}$, wherein $R^2$ and $R^{2'}$ each independently comprise one or more of a linear or branched $C_{1-24}$ alkyl, substituted linear or branched $C_{1-24}$ alkyl, substituted or unsubstituted $C_{5-7}$ cyclic alkyl, and benzyl substituted with alkyl, alkoxy, or thio.

In some embodiments, the second precursor has a structure as illustrated in Table 2. In Table 2, $n^1$ is an integer in a range from 1 to 12, $n^2$ is an integer in a range from 1 to 3, $R^3$ is a substituted linear or branched alkyl, $R^4$ is alkyl or alkoxy, and m is an integer in a range from 1 to 5. In some embodiments, $n^1$ is 1, 2, 3, 4, 5, 6, 7, 8, 9, 10, 11, or 12. In some embodiments, $n^2$ is 1, 2, or 3. In some embodiments, m is 1, 2, 3, 4, or 5.

TABLE 2

| Structures of amine second precursors according to some embodiments. | |
|---|---|
| Second Precursor Structure | |
| 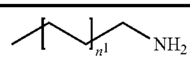 | 1 |
| 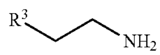 | 2 |
| 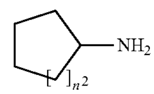 | 3 |
| 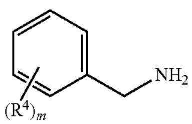 | 4 |

In one or more embodiments, the second precursor may remain in the substrate processing region for a period of time to nearly, or completely, form the passivation layer on the metal surface. The second precursor may be delivered in alternating pulses to grow the passivation layer. In some embodiments, the pulse times of the second precursor may be greater than or equal to 0.1 seconds, greater than or equal to 1 second, greater than or equal to 2 seconds, greater than or equal to 3 seconds, greater than or equal to 4 seconds, greater than or equal to 5 seconds, greater than or equal to 10 seconds, greater than or equal to 20 seconds, greater than or equal to 40 seconds, greater than or equal to 60 seconds, greater than or equal to 80 seconds, greater than or equal to 100 seconds, or more.

In some embodiments, the ADC of general formula (III) or the complex of general formula (IV) are formed in situ on the metal surface 104. In some embodiments, the in situ formation occurs by a nucleophilic addition between the first precursor and the second precursor.

Without intending to be bound by theory, it is believed that the ADC and other carbene complexes described herein form a highly stable passivation layer on metal surfaces because carbene species are strong sigma-donors into unoccupied electron levels of metal surfaces. In some embodiments, the N-substituents of the carbene precursors described herein may be individually selected on both the isonitrile first precursor and the second precursor to fine-tune steric and electronic properties of the complexes of the passivation layer. In some embodiments, the precursors themselves are commercially available, thus not requiring chemical synthesis, or can be synthesized from commercially available reagents in a small number of steps.

In some embodiments, the nucleophilic addition of the first precursor and the second precursor leads to a clean deposition of carbene complexes on the metal surface, with little or no undesirable byproducts. As used herein, the term "clean deposition" means that there is less than 5%, less than 4%, less than 3%, less than 2%, or less than 1% of undesirable byproducts on the metal surface on an atomic basis.

In some embodiments of the methods provided herein, the methods may comprise removing one or more of a first precursor effluent from the substrate. In some embodiments, the methods may comprise removing one or more of a second precursor effluent from the substrate. The removing of one or more first precursor effluent or one or more second precursor effluent may comprise purging of the processing chamber. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of one or more reactive species by any suitable technique including, but not limited to, moving the substrate through a gas curtain to a portion or sector of the processing chamber that contains none or substantially none of the one or more reactive species. In some embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of nitrogen ($N_2$), helium (He), neon (Ne), and argon (Ar).

In some embodiments, methods of depositing a passivation layer may deposit the passivation layer selectively on the metal surface 104 of the semiconductor substrate, such that none or less of the passivation layer is deposited on the non-metal or dielectric surface 102, or surface of a different metal than the selected surface, of the semiconductor substrate.

As used herein, the phrase "selectively over," or similar phrases, means that the subject material is deposited on the stated surface to a greater extent than on another surface. In some embodiments, "selectively" means that the subject material forms on the selective surface at a rate greater than or equal to about 10×, 15×, 20×, 25×, 30×, 35×, 40×, 45× or 50× the rate of formation on the non-selected surface. In some embodiments, the passivation layer forms on the metal surface 104 and does not form on the non-metal surface 102 with a selectivity ratio of at least about 10:1, or at least about 100:1, or at least about 1000:1.

Embodiments of the present technology include selectively depositing a passivation layer on a semiconductor surface. Exemplary methods may include a first process cycle comprising exposing the semiconductor substrate comprising a metal surface and a non-metal surface to a first precursor to form a first portion of the passivation layer on the metal surface, and exposing the semiconductor substrate to a second precursor to form the passivation layer on the metal surface; and repeating the first process cycle n number of times, wherein n is an integer in a range from 1 to 100, to form the metal layer saturated with the passivation layer.

Figure 3:
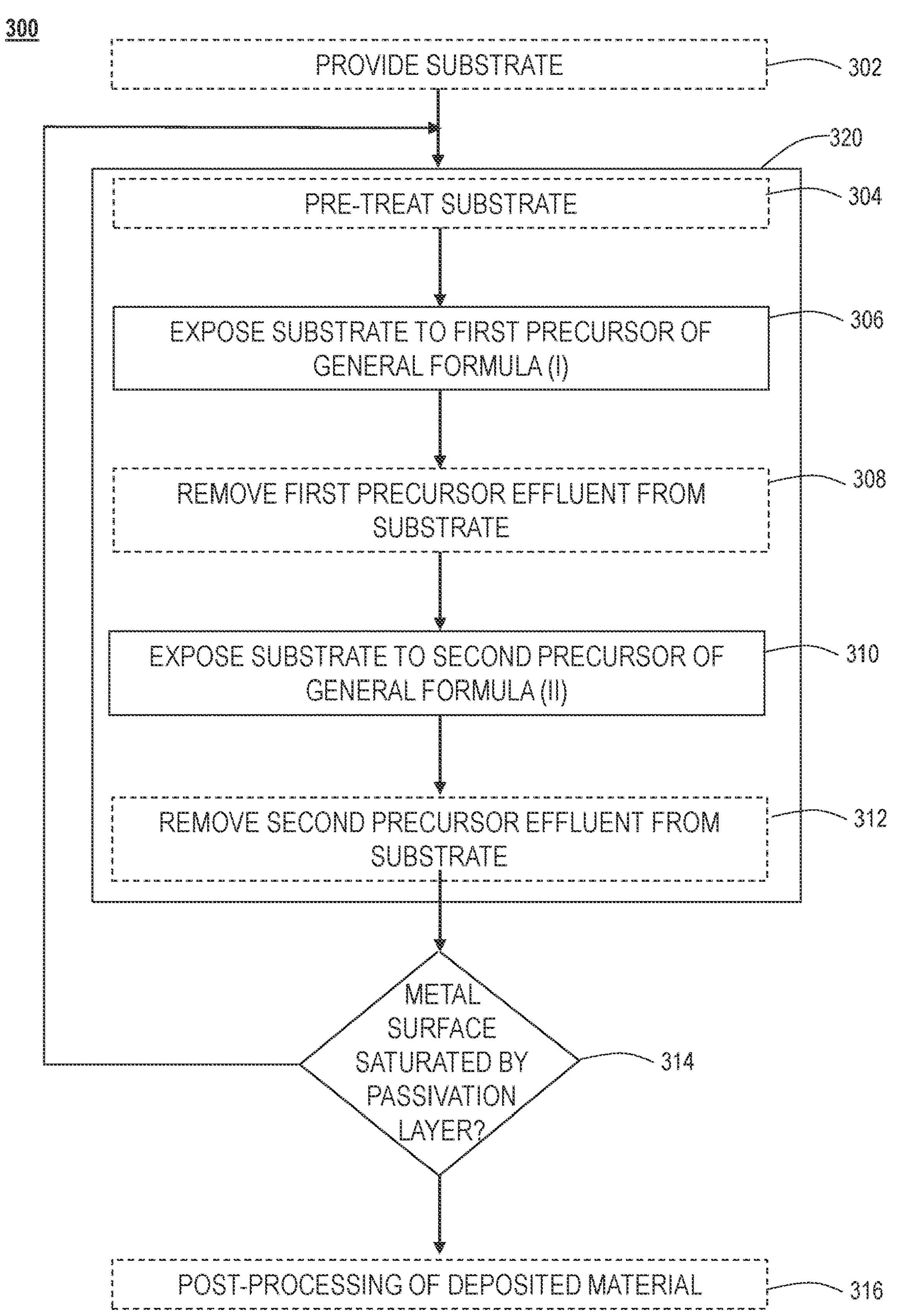
FIG. 3 illustrates a process flow diagram of a method of selectively depositing a passivation layer on a substrate according to one or more embodiments.

In some embodiments, the methods described herein are illustrated by a flow diagram as illustrated in FIG. 3. Referring to FIG. 3, in one or more embodiments, the illustrated method 300 includes an operation 302, where a substrate is optionally provided to the processing chamber.

As used herein, the term "provided" means that the substrate is made available for processing (e.g., positioned in a processing chamber). As used herein, the term "processing chamber" also includes portions of a processing chamber adjacent to the substrate surface without encompassing the complete interior volume of the processing chamber.

In one or more embodiments, a first process cycle 320 is performed. In the first process cycle, in one or more embodiments, at operation 304, the substrate is optionally pretreated. The pre-treating may polish, coat, dope, etch, reduce, oxidize, hydroxylate, anneal, UV cure, e-beam cure and/or bake the substrate. In some embodiments, the substrate may be pre-treated with one or more of high temperature annealing, plasma treatment, and gas annealing. Plasma treatment may include treatment with a plasma selected from one or more of hydrogen ($H_2$), oxygen ($O_2$), ammonia ($NH_3$), nitrogen ($N_2$), carbon dioxide ($CO_2$), nitrous oxide ($N_2O$), argon (Ar), and the like. Gas annealing may include annealing in an atmosphere of one or more of hydrogen ($H_2$), oxygen ($O_2$), ozone ($O_3$), nitrous oxide ($N_2O$), water ($H_2O$), hydrogen peroxide ($H_2O_2$), and the like.

In some embodiments, the metal surface 104 is pretreated or cleaned with a plasma. In some embodiments, the plasma is a conductively coupled plasma (CCP). In some embodiments, the plasma is an inductively coupled plasma (ICP).

In addition to any of the methods described herein on the metal surface 104 itself, in the present disclosure, any of the treatments or pre-treatments disclosed may also be performed on an underlayer metal surface, and the term "dielectric surface" is intended to include such underlayer as the context indicates. Thus, for example, where a film/layer or partial film/layer has been deposited onto the metal surface, the exposed surface of the newly deposited film/layer becomes the metal surface.

In one or more embodiments, at operation 306, the substrate is exposed to a first precursor of general formula (I). The first precursor may coordinate to the metal in the metal surface 104 selectively over the non-metal surface 102.

In some embodiments, at operation 308, a first precursor effluent is optionally removed from the substituent. The first precursor effluent may comprise first precursor present in the processing chamber that is not bound to the metal surface, or it may comprise a portion of the first precursor, such as a reaction product thereof.

In some embodiments, at operation 310, the substrate is exposed to a second precursor of general formula (II). In some embodiments, the second precursor may react with the bound first precursor to form an ADC of general formula (III) if the second precursor is an amine. In other embodiments, the second precursor may react with the bound first precursor to form a complex of general formula (IV) if the second precursor is an alcohol or a thiol. Referring to FIGS. 1-2, in some embodiments, exposing the substrate to the second precursor forms a passivation layer on metal surface 104, the passivation layer being formed substantially from complex 112 if the second precursor is an amine, or being formed substantially from complex 212 if the second precursor is an alcohol or a thiol.

In some embodiments, at operation 312, a second precursor effluent is optionally removed from the substituent. The second precursor effluent may comprise second precursor present in the processing chamber that is not bound to the metal surface, or it may comprise a portion of the second precursor, such as a reaction product thereof. The operation 312 may include purging, where the purging can be the same process or different process as that described above. Purging the processing chamber, portion of the processing chamber, area adjacent the substrate surface, etc., removes unreacted reactant, reaction products, and by-products from the area adjacent the substrate surface.

In some embodiments, the first process cycle 320 comprises operations 304 through 312 as illustrated in FIG. 4. In some embodiments, at operation 314, there is a determination or decision point 314 of whether saturation of the metal surface by the passivation layer has been achieved following one or more process cycles 320. If saturation of the metal surface has not been achieved, another process cycle 320 is conducted. If saturation of the metal surface has been achieved, then, in some embodiments, another process cycle 320 is not conducted. In one or more embodiments, at operation 216, an optional post-processing of the deposited material on the substrate is conducted if saturation of the metal surface has been achieved.

In some embodiments, the processing region is in a modular system comprising multiple chambers which perform various functions including substrate center-finding and orientation, degassing, annealing, deposition and/or etching. According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation, and other substrate processes. By carrying out processes in the processing chamber of a modular system, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, the inert gas is used to purge or remove some or all of the reactants (e.g., reactant). According to one or more embodiments, the inert gas is injected at the exit of the processing chamber to prevent reactants (e.g., reactant) from moving from the processing chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the reactive gases. During substrate movement, different portions of the substrate surface, or material on the substrate surface, are exposed to the two or more reactive gases so that any given point on the substrate is substantially not exposed to more than one reactive gas simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a reactive gas may vary according to the flow rate of the reactive gas, the temperature of the process gas, the type of control valve, the type of process chamber employed, as well as the ability of the components of the process gas to adsorb onto the substrate. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Once the passivation layer is deposited, the method may optionally include further processing (e.g., bulk deposition of a dielectric film). In some embodiments, the further processing may be an ALD process.

The disclosure provides that the processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor or controller, transforms the general-purpose computer into a specific purpose computer (controller) that controls the chamber operation such that the processes are performed. The process can be stored on non-transitory computer readable medium including instructions, that, when executed by a controller of a substrate processing chamber, causes the substrate processing chamber to perform the operations of: expose a semiconductor substrate comprising a metal surface and a non-metal surface to a first precursor to form a first portion of a passivation layer on the metal surface, wherein the first precursor may comprise an isonitrile of general formula (I); and expose the semiconductor substrate comprising a metal surface and a non-metal surface to a second precursor to form the passivation layer on the metal surface, wherein the second precursor may have a general formula (II), such that a passivation layer is selectively deposited on the metal surface of the semiconductor substrate.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selectively depositing a passivation layer on a semiconductor substrate, the method comprising:

exposing the semiconductor substrate comprising a metal surface and a non-metal surface to a first precursor to form a first portion of the passivation layer on the metal surface, the first precursor comprising an isonitrile of general formula (I):

(I)

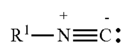

wherein $R^1$ comprises one or more of a linear alkyl, branched alkyl, cyclic alkyl, substituted or unsubstituted benzyl, silyl, and substituted or unsubstituted aryl groups; and exposing the semiconductor substrate comprising a metal surface and a non-metal surface to a second precursor to form the passivation layer on the metal surface, the second precursor having a general formula (II):

(II)

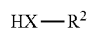

wherein $R^2$ comprises one or more of a linear or branched $C_{1-24}$ alkyl, substituted linear or branched $C_{1-24}$ alkyl, substituted or unsubstituted $C_{5-7}$ cyclic alkyl, and benzyl substituted with alkyl, alkoxy, or thio, and X comprises —NH—, —O—, or —S—.

2. The method of claim 1, wherein the second precursor is an amine.

3. The method of claim 2, wherein the first precursor and the second precursor react via a nucleophilic addition to form a complex on the metal surface, the complex comprising an acyclic diamino carbene (ADC) of general formula (III):

(III)

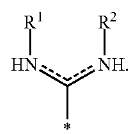

4. The method of claim 3, wherein the ADC of general formula (III) is formed in situ on the metal surface.

5. The method of claim 2, wherein the second precursor of general formula (II) is selected from the group consisting of:

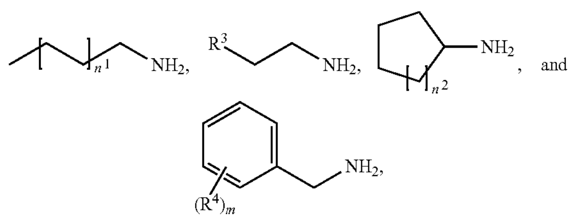

wherein $n^1$ is an integer in a range from 1 to 12, $n^2$ is an integer in a range from 1 to 3, $R^3$ is a substituted linear or branched alkyl, $R^4$ is alkyl or alkoxy, and m is an integer in a range of from 1 to 5.

6. The method of claim 2, wherein the second precursor of general formula (II) is a highly nucleophilic amine or a secondary amine.

7. The method of claim 6, wherein the highly nucleophilic amine comprises one or more t-$BuNH_2$ groups.

8. The method of claim 1, wherein the second precursor is an alcohol or a thiol.

9. The method of claim 8, wherein the first precursor and the second precursor react via a nucleophilic addition to form a complex on the metal surface, the complex comprising a species of general formula (IV):

(IV)

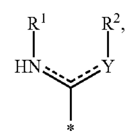

wherein Y is O if the second precursor is an alcohol or S if the second precursor is a thiol.

10. The method of claim 9, wherein the complex of general formula (IV) is formed in situ on the metal surface.

11. The method of claim 1, wherein the first precursor comprises one or more of a linear, branched or cyclic alkyl substituted with one or more electron withdrawing group (EWG) selected from the group consisting of —$NO_2$, —$CF_3$ and sulfonyl or an aromatic ring substituted with one or more electron withdrawing group (EWG) selected from the group consisting of —$NO_2$, —$CF_3$ and sulfonyl.

12. The method of claim 1, wherein the isonitrile of general formula (I) is selected from the group consisting of:

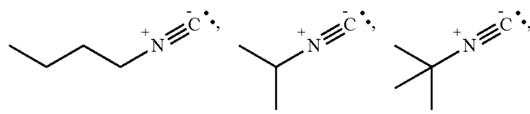

-continued

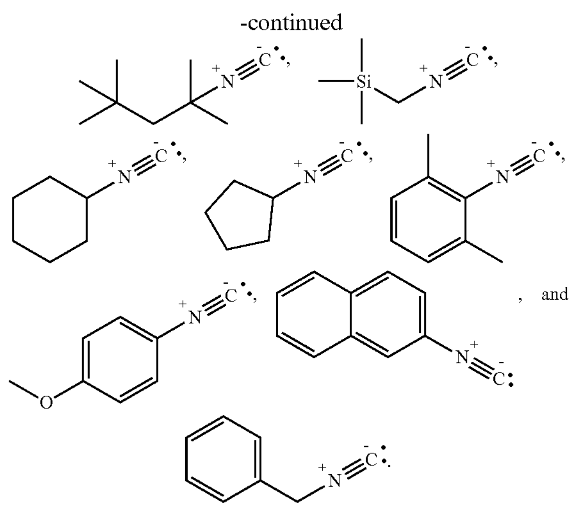

, and

13. The method of claim 1, further comprising removing one or more of a first precursor effluent comprising the first precursor from the substrate and a second precursor effluent comprising the second precursor from the substrate.

14. A method of selectively depositing a passivation layer on a semiconductor substrate, the method comprising:

a first process cycle comprising exposing the semiconductor substrate comprising a metal surface and a non-metal surface to a first precursor to form a first portion of the passivation layer on the metal surface, the first precursor comprising an isonitrile of general formula (I):

(I)

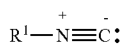

$R^1$ comprising one or more of a linear alkyl, branched alkyl, cyclic alkyl, substituted or unsubstituted benzyl, silyl, and substituted or unsubstituted aryl groups and exposing the semiconductor substrate comprising a metal surface and a non-metal surface to a second precursor to form the passivation layer on the metal surface, the second precursor having a general formula (II):

(II)

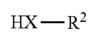

$R^2$ comprising one or more of a linear or branched $C_{1-24}$ alkyl, substituted linear or branched $C_{1-24}$ alkyl, substituted or unsubstituted $C_{5-7}$ cyclic alkyl, and benzyl substituted with alkyl, alkoxy, or thio, and X comprising —NH—, —O—, or —S—; and repeating the first process cycle n number of times wherein n is an integer in a range of from 1 to 100 to form the metal layer saturated with the passivation layer.

15. The method of claim 14, wherein the first precursor and the second precursor react via a nucleophilic addition to form a complex on the metal surface, the complex comprising an acyclic diamino carbene (ADC) of general formula (III):

(III)

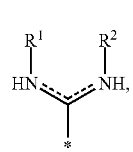

and the complex is formed in situ on the metal surface.

16. The method of claim 14, wherein the first precursor and the second precursor react via a nucleophilic addition to form a complex on the metal surface, the complex comprising a species of general formula (IV):

(IV)

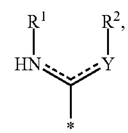

wherein Y is O if the second precursor is an alcohol or S if the second precursor is a thiol, and the complex is formed in situ on the metal surface.

17. The method of claim 14, wherein the first precursor comprises a linear, branched or cyclic alkyl substituted with one or more electron withdrawing group (EWG) selected from the group consisting of —$NO_2$, —$CF_3$ and sulfonyl or the aromatic ring substituted with one or more electron withdrawing group (EWG) selected from the group consisting of —$NO_2$, —$CF_3$ and sulfonyl.

18. The method of claim 14, wherein the isonitrile of general formula (I) is selected from the group consisting of:

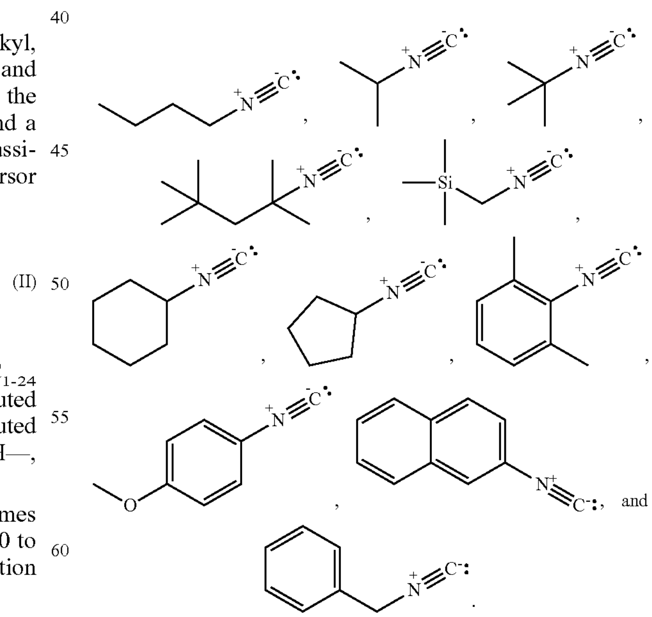

19. The method of claim 14, wherein the second precursor of general formula (II) is selected from the group consisting of:

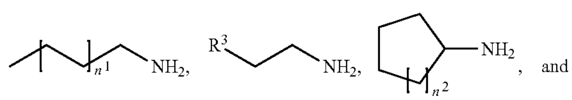
and
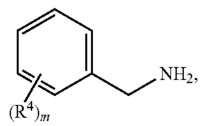
wherein $n^1$ is an integer in a range from 1 to 12, $n^2$ is an integer in a range from 1 to 3, $R^3$ is a substituted linear or branched alkyl, $R^4$ is alkyl or alkoxy, and m is an integer in a range of from 1 to 5.
20. The method of claim 14, wherein the second precursor of general formula (II) is a highly nucleophilic amine comprising one or more t-$BuNH_2$ groups or a secondary amine.
* * * * *